(12) United States Patent
Leung et al.

(10) Patent No.: US 7,111,199 B2
(45) Date of Patent: Sep. 19, 2006

(54) BUILT-IN DEBUG FEATURE FOR COMPLEX VLSI CHIP

(75) Inventors: Ho-Ming Leung, Cupertino, CA (US); Fan Zhang, San Jose, CA (US); Chiu-Tsun Chu, Cupertino, CA (US); Gary Chang, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 517 days.

(21) Appl. No.: 10/190,933

(22) Filed: Jul. 8, 2002

(65) Prior Publication Data

US 2004/0004279 A1    Jan. 8, 2004

(51) Int. Cl.
*G06F 11/00* (2006.01)
(52) U.S. Cl. .......................... 714/30; 714/733
(58) Field of Classification Search ............ 714/30–31, 714/724–726, 729, 733–734, 28, 39, 41
See application file for complete search history.

(56) References Cited

U.S. PATENT DOCUMENTS

| | | | |
|---|---|---|---|
| 5,425,036 A * | 6/1995 | Liu et al. ..................... 714/735 |
| 6,363,507 B1 * | 3/2002 | Truebenbach et al. ...... 714/734 |
| 6,598,192 B1 | 7/2003 | McLaurin et al. .......... 714/726 |
| 6,665,828 B1 | 12/2003 | Arimilli et al. ............. 714/726 |
| 6,675,333 B1 * | 1/2004 | Whetsel et al. ............. 714/726 |
| 6,718,498 B1 | 4/2004 | Imark et al. ................ 714/741 |
| 6,738,929 B1 * | 5/2004 | Swoboda et al. ............ 714/28 |
| 6,754,852 B1 * | 6/2004 | Swoboda ..................... 714/39 |
| 6,754,862 B1 * | 6/2004 | Hoyer et al. ................ 714/725 |
| 2002/0138801 A1 | 9/2002 | Wang et al. ................ 714/729 |

* cited by examiner

*Primary Examiner*—Dieu-Minh Le
(74) *Attorney, Agent, or Firm*—Christopher P. Maiorana, P.C.

(57) ABSTRACT

An apparatus comprising (i) a first circuit configured to generate one or more node signals at one or more internal nodes and (ii) a second circuit configured to present one or more of the node signals and a trigger signal in response to one or more control signals.

20 Claims, 4 Drawing Sheets

BUILT-IN DEBUG FEATURE FOR COMPLEX VLSI CHIP

FIELD OF THE INVENTION

The present invention relates to integrated circuit testing generally and, more particularly, to a built-in debug feature for complex very large scale integrated (VLSI) chips.

BACKGROUND OF THE INVENTION

Testing integrated circuits is expensive and time consuming. Complex very large scale integrated (VLSI) chips can have millions of internal nodes. Probing all of the nodes in the silicon during a debug process is difficult.

Existing solutions are inefficient, time consuming and expensive. Existing test methods include opening up a chip and using an electronic probing device. Opening up a chip can destroy the chip. Electronic probing tests one node at a time. The entire set up (i.e., chip, circuit board and system) can be too large to fit inside a vacuum chamber. Testing can require special infinite loop test patterns. However, the test patterns may not be able to reproduce the problem.

It would be desirable to implement a built-in logic to allow observation of internal nodes of a chip under normal operating conditions.

SUMMARY OF THE INVENTION

The present invention concerns an apparatus comprising (i) a first circuit configured to generate one or more node signals at one or more internal nodes and (ii) a second circuit configured to present one or more of the node signals and a trigger signal in response to one or more control signals.

The objects, features and advantages of the present invention include providing a built-in debug feature for complex very large scale integrated (VLSI) chips that may (i) provide built-in logic to present signal levels at selected internal nodes to an internal register or external I/O ports, (ii) select the internal nodes under control of a programmable register, (iii) generate a trigger signal, (iv) start and stop an internal clock, (v) provide a single-step operation, (vi) work under normal operating conditions, (vii) capture signal levels at many nodes simultaneously, (viii) be implemented with low cost, (ix) operate without special lab equipment, (x) allow node waveforms to be captured by an external logic analyzer, (xi) allow node waveforms to be captured by an external PC, (xii) capture node waveforms with an internal processor and/or (xiii) be implemented in both digital and analog circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
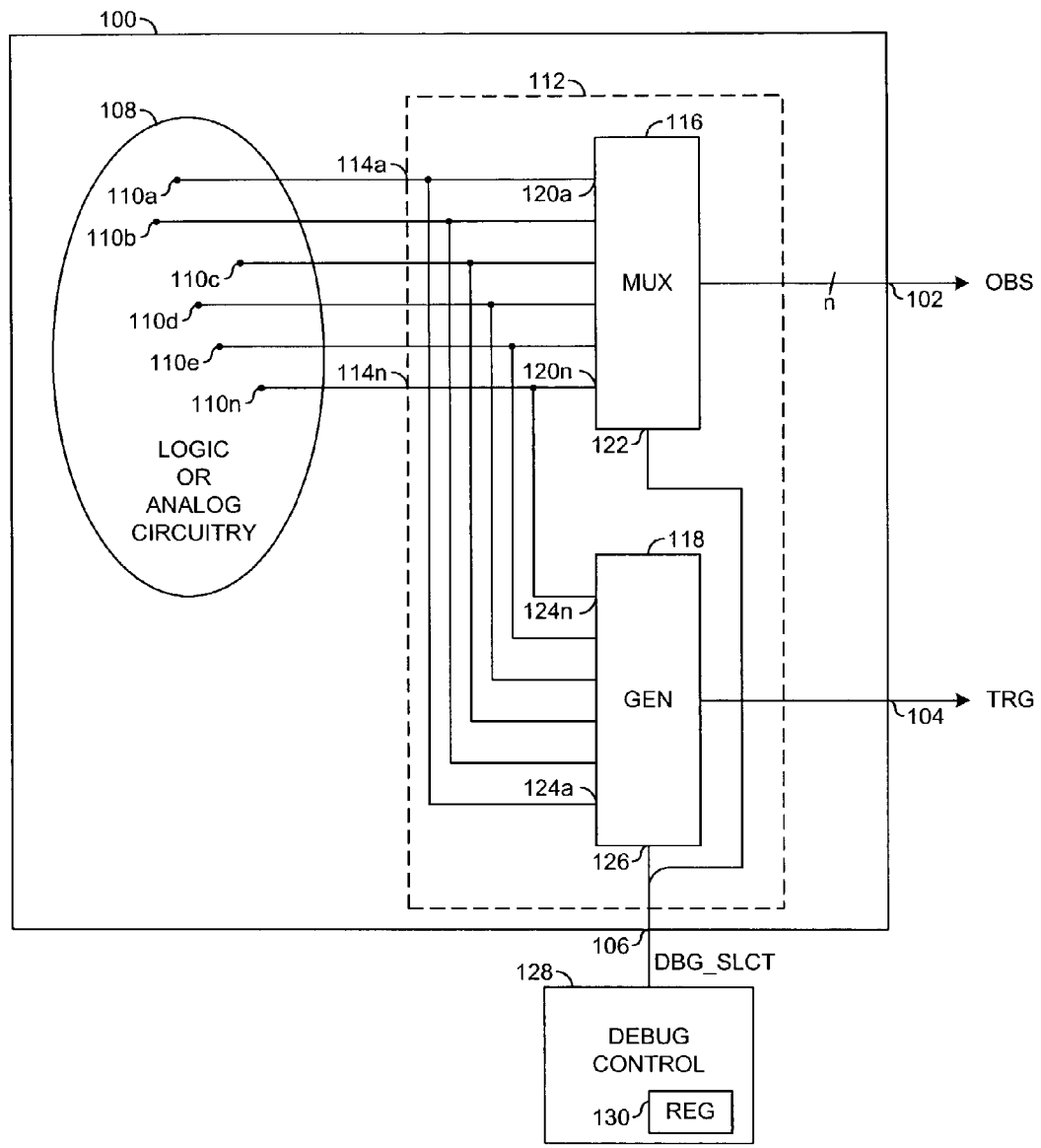
FIG. 1 is a block diagram of a preferred embodiment of the present invention.

Referring to FIG. 1, a block diagram of a circuit 100 is shown in accordance with a preferred embodiment of the present invention. The circuit 100 may comprise, in one example, a complex very large scale integrated circuit. In one example, the circuit 100 may be implemented as a logic module of a programmable logic device (circuit). The circuit 100 may have an output 102 that may present a signal (e.g., OBS), an output 104 that may present a signal (e.g., TRG) and an input 106 that may receive a signal (e.g., DBG_SLCT). The signal OBS may comprise one or more internal signals of the circuit 100. For example, the signal OBS may be a multi-bit signal where each of the bits may represent a signal of a different internal node. The signal TRG may be implemented, in one example, as a trigger signal. The signal TRG may have an asserted state that generally corresponds to a valid state of the signal OBS. The signal DBG_SLCT may be implemented as a control signal. The signal DBG_SLCT may, in one example, comprise one or more control signals. For example, the signal DBG_SLCT may be a multi-bit signal where each of the bits may be implemented as an independent control signal.

The circuit 100 may be configured to present the signals OBS and TRG in response to the signal DBG_SLCT. The outputs 102 and 104 may be configured to present output signals of the circuit 100 in a first mode and debug signals (e.g., internal node signals) in a second mode. In one example, the mode of the outputs 102 and 104 may be controlled in response to a debug flag (e.g., a bit in a debug register within the circuit 100). The circuit 100 may be configured to present the signals OBS and TRG while running at normal (or full) operating speed. Alternatively, the circuit 100 may be configured to provide a single-stepping mode.

The circuit 100 may comprise logic and/or analog circuitry 108. The circuitry 108 may comprise a number of internal nodes 110a–110n. Node signals present at the internal nodes 110a–110n are generally indicative of an operating condition of the circuit 100. In general, a debug process for the circuit 100 may involve measurement (or observation) of one or more of the node signals presented at the internal nodes 110a–110n.

The circuit 100 may further comprise a circuit 112. The circuit 112 may have a number of inputs 114a–114n that may be configured to receive (or monitor) the signals from the nodes 110a–110n.

The circuit 112 is generally configured to generate the signals OBS and TRG in response to the signals received at the inputs 114a–114n and the signal DBG_SLCT.

The circuit 112 may comprise, in one example, a circuit 116 and a circuit 118. The circuit 116 may be implemented, in one example, as a multiplexer circuit. The circuit 118 may be implemented, in one example, as a trigger generation circuit. In an alternative example, the circuit 118 may be implemented as a multiplexer circuit. The circuit 116 may have a number of inputs 120a–120n that may receive the signals generated by the internal nodes 110a–110n and an input 122 that may receive the signal DBG_SLCT. The circuit 116 may be configured to generate the signal OBS in response to the signals received from the nodes 110a–110n and the signal DBG_SLCT. In one example, the circuit 116 may be configured to select one or more of the signals received from the internal nodes 110a–110n for presentation as the signal OBS in response to the signal DBG_SLCT. In another example, all of the signals received from the internal nodes 110a–110n may be multiplexed (e.g., time division multiplexed) onto the signal OBS in response to the signal DBG_SLCT.

The circuit 118 may have a number of inputs 124a–124n that may receive the signals generated at the internal nodes 110a–110n and an input 126 that may receive the signal DBG_SLCT. The circuit 118 may be configured to generate the signal TRG in response to the signals received from the internal nodes 110a–110n and the signal DBG_SLCT. In one example, the circuit 118 may be configured to generate the signal TRG in response to a logical combination of one or more of the signals received from the internal nodes 110a–110n. The particular logical combination implemented and/or the particular signals combined may be controlled in response to the signal DBG_SLCT. For example, in a preferred embodiment the circuit 118 may be configured to generate the signal TRG as a logical AND of all of the signals received from the internal nodes 110a–110n. However, other logical combinations may be implemented accordingly to meet the design parameters of the particular application.

In an alternative embodiment, the circuit 118 may be implemented as a multiplexer circuit. When the circuit 118 is implemented as a multiplexer circuit, the signal TRG may be generated in response to one or more of the signals received from the internal nodes 110a–110n selected in response to the signal DBG_SLCT. The signal TRG may be implemented to trigger a logic analyzer (e.g., either internal or external) to capture the signals received from the internal nodes 110a–110n.

A circuit 128 may be configured to generate the signal DBG_SLCT. In one example, the circuit 128 may be implemented externally to the circuit 100. Alternatively, the circuit 128 may be implemented internally to the circuit 100. In one example, the circuit 128 may comprise a register 130. The register 130 may be implemented as a debug register. The register 130 may be programmed according to pre-defined criteria. The signal DBG_SLCT may be generated in response to contents of the register 130.

Figure 2:
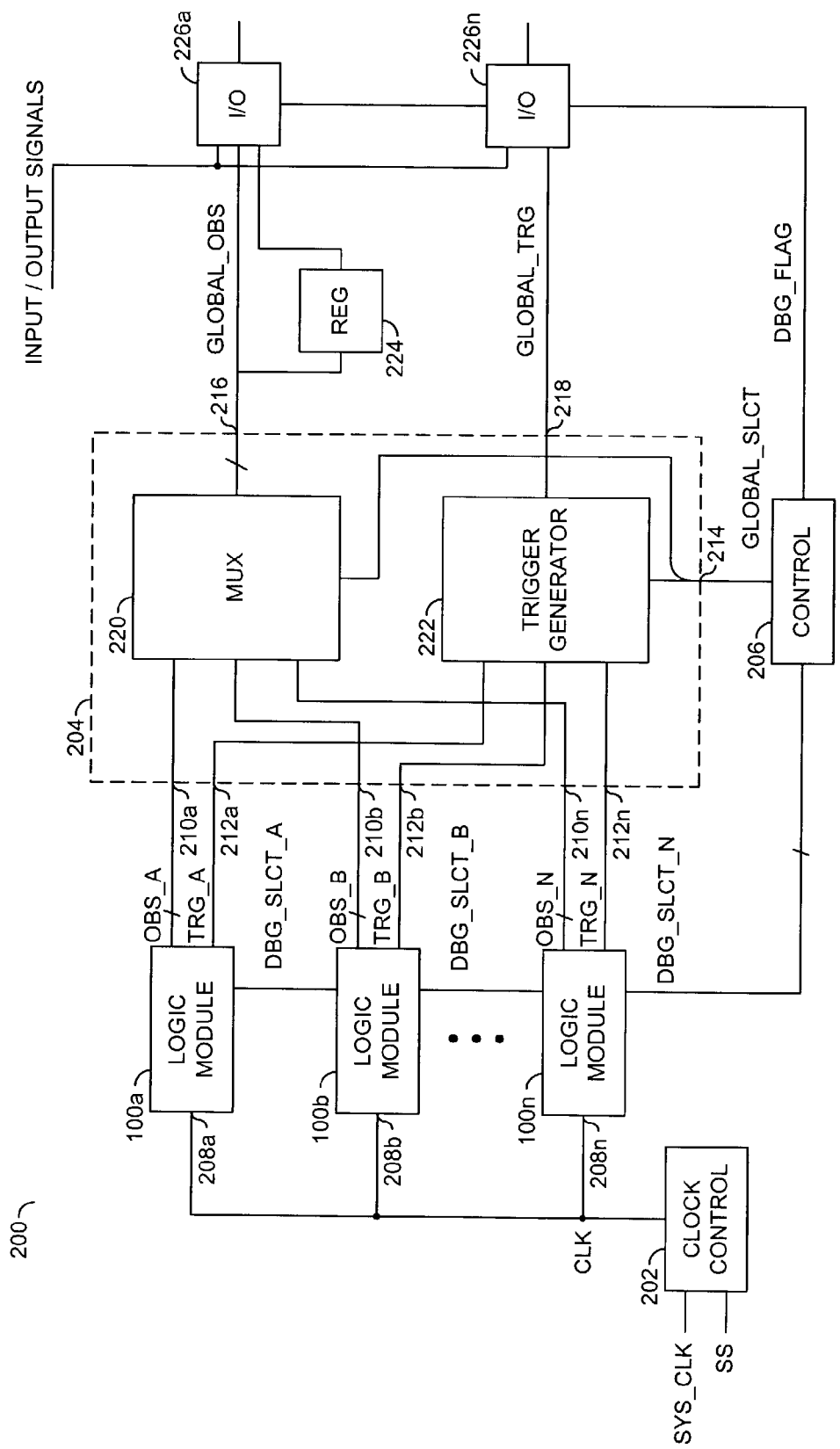
FIG. 2 is a block diagram of another preferred embodiment of the present invention.

Referring to FIG. 2, a block diagram of a system 200 is shown in accordance with a preferred embodiment of the present invention. The system 200 may comprise a number of circuits 100a–100n. Each of the circuits 110a–100n may be implemented similarly to the circuit 100 of FIG. 1. For example, the system 200 may be implemented as a programmable logic device and each of the circuits 110a–100n may be implemented as a logic module of the system 200. The system 200 may further comprise a circuit 202, a circuit 204 and a circuit 206. The circuit 202 may be implemented, in one example, as a clock control circuit. The circuit 204 may be implemented as a monitor circuit. The circuit 206 may be implemented as a control circuit.

In one example, the circuit 202 may have a first input that may receive a signal (e.g., SYS_CLK), a second input that may receive a signal (e.g., SS) and an output that may present a signal (e.g., CLK). The signal CLK may be generated in response to the signals SYS_CLK and SS. The signals SYS_CLK and CLK may be clock signals. The signal SS may be implemented as a control signal. In one example, the circuit 202 may be configured to generate the signal CLK having (i) a similar frequency to the signal SYS_CLK when the signal SS is in a first state (e.g., unasserted) and/or (ii) a single pulse of the signal SYS_CLK in response to a second state (e.g., asserted) of the signal SS. The signal CLK may be presented to a respective input 208a–208n of each of the circuits 100a–100n. The signal SS may be implemented, in one example, to provide both full speed (e.g., for real-time observation and/or measurement) and single-step operation of the system 200.

The circuit 204 may have a number of inputs 210a–210n that may receive a number of signals (e.g., OBS_A-CBS_N) from the circuits 100a–100n, a number of inputs 212a–212n that may receive a number of signals (e.g., TRG_A-TRG_N) from the circuits 100a–100n, an input 214 that may receive a signal (e.g., GLBL_SLCT), an output 216 that may present a signal (e.g., GLOBAL_OBS) and an output 218 that may present a signal (e.g., GLOBAL_TRG). The circuits 100a–100n may be configured to generate the signals OBS_A-OBS_N and TRG_A-TRG_N in response to a number of control signals (e.g., DBG_SLCT_A-DBG_SLCT_N). The circuit 204 may be configured to generate the signals GLOBAL_OBS and GLOBAL_TRG in response to the signals OBS_A-OBS_N, TRG_A-TRG_N and GLBL_SLCT.

The circuit 204 may be implemented similarly to the circuit 112 (described above in connection with FIG. 1). In one example, the circuit 204 may comprise a circuit 220 and a circuit 222. The circuit 220 may be implemented as a multiplexer circuit. The circuit 222 may be implemented, in one example, as a trigger generator circuit. The circuit 220 may be configured to select one or more of the signals OBS_A-OBS_N for presentation as the signal GLOBAL_OBS in response to the signal GLOBAL_SLCT.

The circuit 222 may be configured to generate the signal GLOBAL_TRG in response to the signals TRG_A-TRG_N and the signal GLOBAL_SLCT. In one example, the circuit 222 may be configured to generate the signal GLOBAL-_TRG in response to a logical combination of one or more of the signals TRG_A-TRG_N selected in response to the signal GLOBAL_SLCT. Alternatively, the signal GLO-BAL_SLCT may be configured to select the signals TRG_A-TRG_N that are logically combined and/or the logical function applied. The signal GLOBAL_TRG may be configured to trigger an external logic analyzer. For example, the external logic analyzer may be configured to capture the internal node signals presented at the I/Os of the system 200 in response to the signal GLOBAL_TRG.

The circuit 206 may be configured to generate the signals GLBL_SLCT and DBG_SLCT_A-DBG_SLCT_N according to predetermined criteria. In one example, the circuit 206 may be implemented as a debug register that may be programmed in response to a predefined debug (or test) procedure. The circuit 206 may be further configured to generate a signal (e.g., DBG_FLAG). In one example, the signal DBG_FLAG may be implemented as an internal debug flag. In one example, the signal DBG_FLAG may be asserted in response to software programming of an internal register bit. The signal DBG_FLAG may be asserted to indicate a debug mode of the system 200.

The signal GLOBAL_OBS may be presented to an input of a circuit 224. The circuit 224 may be implemented, in one example, as a capture register. However, other storage elements may be implemented accordingly to meet the design criteria of a particular application. For example, the circuit 224 may be implemented with latches, flip-flops, sample and hold circuits, etc. In one example, the circuit 224 may be configured to latch the signal GLOBAL_OBS in response to the signal GLOBAL_TRG.

The system 200 may comprise a number of I/O pads 226a–226n. In one example, the signal GLOBAL_OBS, registered and/or unregistered, and the signal GLOBAL-_TRG may be multiplexed on the I/O pads with other input/output signals in response to the signal DBG_FLAG. In one example, the signals GLOBAL_OBS and GLOBAL_TRG may be presented to external circuitry via the pads 226a–226n when the signal DBG_FLAG is in a first state (e.g., an asserted state). I/O signals of the system 200 may be presented via the pads 226a–226n when the signal DBG_FLAG is in a second state (e.g., an unasserted state). The selection of internal signals (e.g., the node signals from the circuits 100a–100n) presented at the pads 226a–226n may be controlled, in one example, in response to software instructions. In one example, the system 200 may have a limited number of I/O pads available. However, when a limited number of pads are available, the system 200 may be configured to present all of the internal nodes via, in one example, a time division multiplex scheme.

Figure 3A:
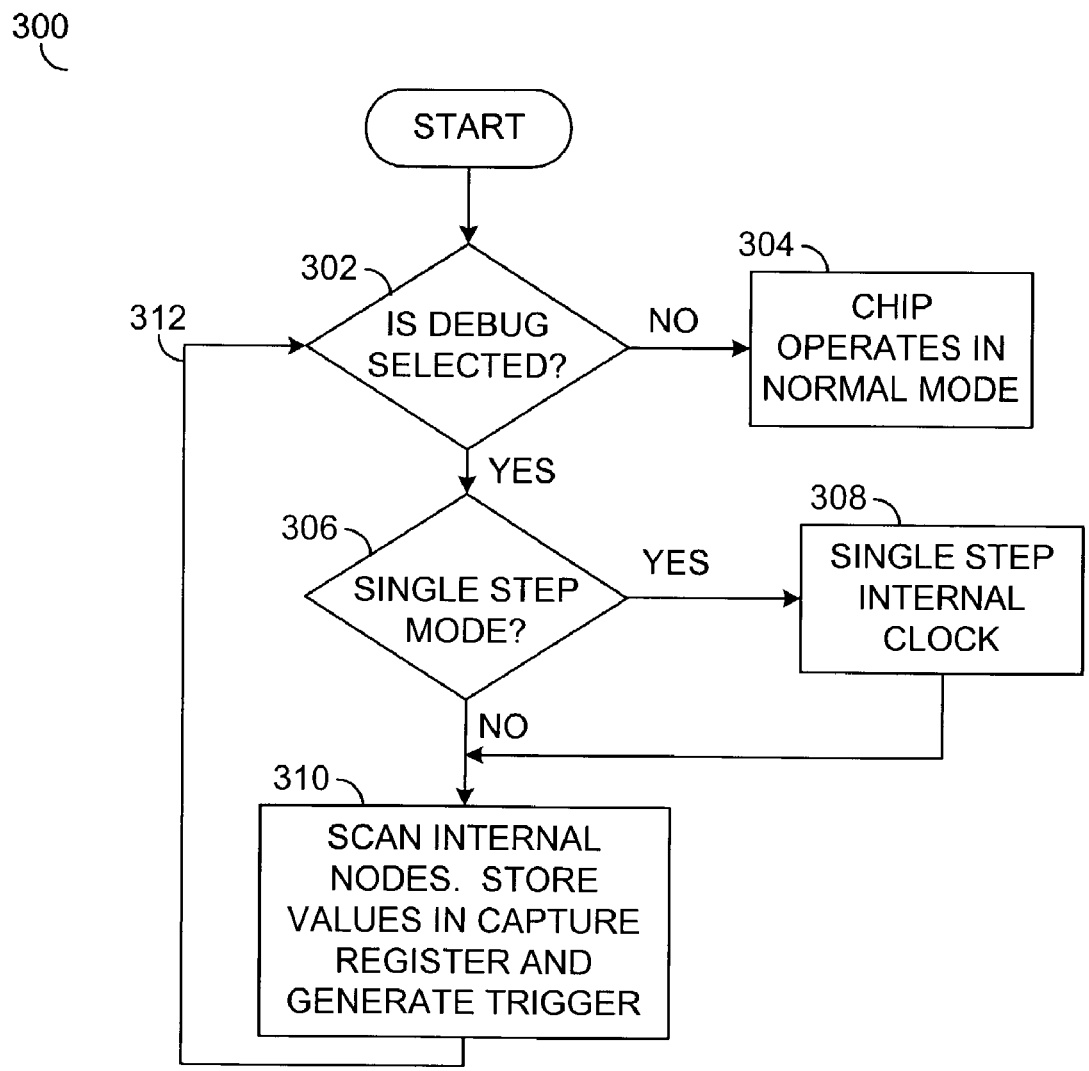
FIGS. 3A and 3B are flow diagrams of example operations in accordance with a preferred embodiment of the present invention.

Referring to FIG. 3A, a flow diagram 300 illustrating an example debug operation in accordance with a preferred embodiment of the present invention is shown. When the circuit 100 and the system 200 are not in a debug mode, the circuit 100 and the system 200 generally operate according to a predefined function and the debug circuitry is generally transparent to the external environment of the chip (e.g., the blocks 302 and 304). When the circuit 100 and system 200 are in a debug mode, the circuit 100 and the system 200 may be configured to operate in a full speed mode and/or a single-step mode (e.g., the block 306). When the single-step mode is selected, an internal clock may be single-stepped (e.g., the block 308). The internal nodes of the circuit 100 or system 200 are generally scanned, the values stored in a capture register and a trigger signal generated (e.g., the block 310). While the circuit 100 and the system 200 are in the debug mode, the scans of the internal nodes may be repeated (e.g., the pathway 312).

Figure 3B:
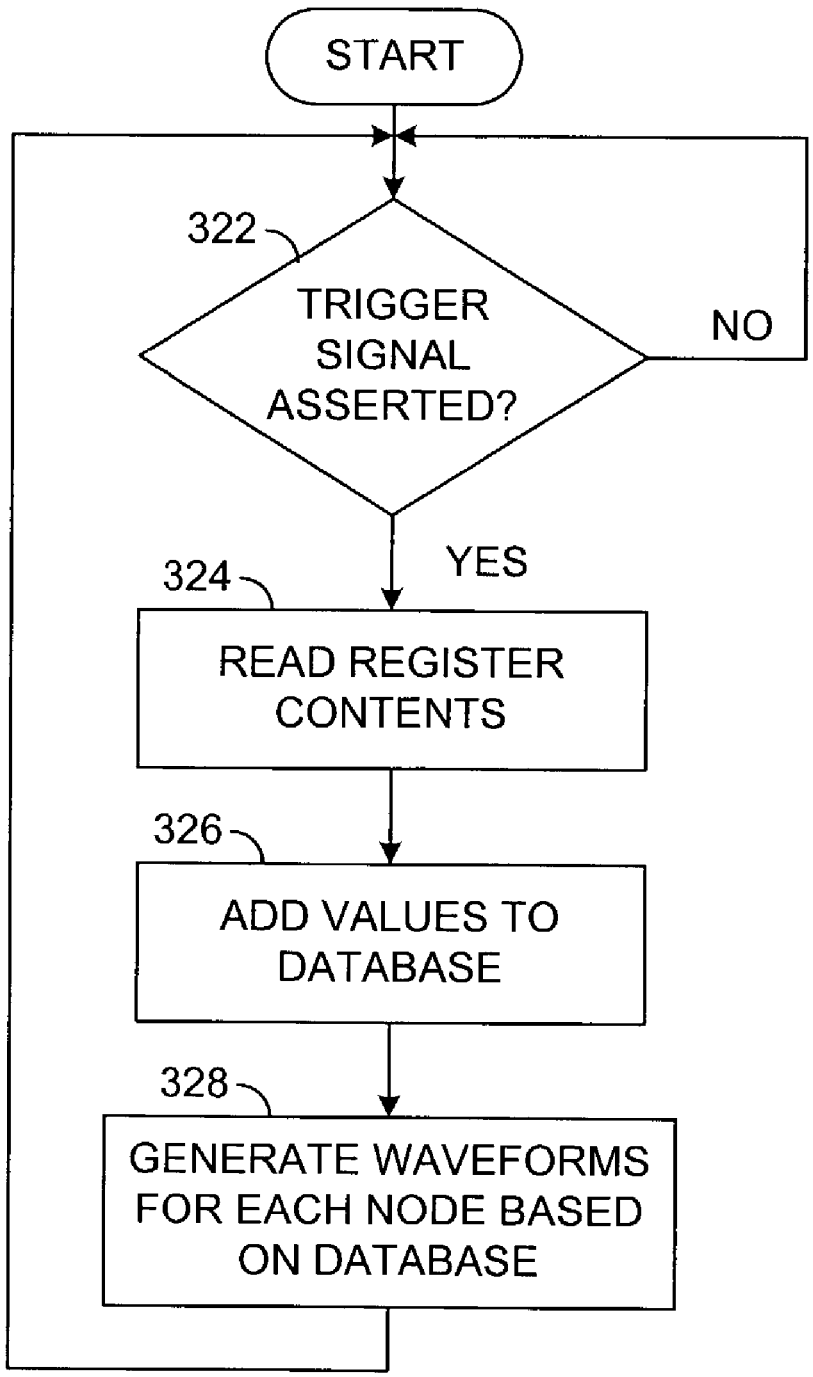

Referring to FIG. 3B, a flow diagram 320 illustrating another example operation in accordance with a preferred embodiment of the present invention is shown. In one example, an internal or external processor (or logic analyzer) may be configured to read the capture register (or the signal GLOBAL_OBS) in response to the signal GLOBAL_TRG (e.g., the block 322). The internal or external processor generally reads values from the capture register in response to an asserted state of the signal GLOBAL_TRG (e.g., the block 324). The values read from the capture register 220 may be added to a database comprising values for one or more of the internal nodes (e.g., the nodes 110a–110n of FIG. 1) for each clock cycle (e.g., the block 326). The internal/external processor may be configured in response to computer readable instructions to generate and/or display one or more waveforms representative of the signals at each of the internal nodes of the circuit 100 or system 200 in response to the values stored in the database (e.g., the block 328). When an internal processor is used to generate the waveforms, the circuit 100 may be configured to provide a logic analyzer function.

The function performed by the flow diagrams 300 and 320 of FIGS. 3A and 3B, respectively, may be implemented using a conventional general purpose digital computer programmed according to the teachings of the present specification, as will be apparent to those skilled in the relevant art (s). Appropriate software coding can readily be prepared by skilled programmers based on the teachings of the present disclosure, as will also be apparent to those skilled in the relevant art(s). The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

The various signals of the present invention are generally shown on individual inputs and outputs. In other embodiments, some or all of the various signals may be multiplexed through one or more inputs and/or outputs as desired or required. The various signals of the present invention may be implemented as single-bit or multi-bit signals in a serial and/or parallel configuration.

The various signals of the present invention are generally "on" (e.g., a digital HIGH, or 1) or "off" (e.g., a digital LOW, or 0). However, the particular polarities of the on (e.g., asserted) and off (e.g., unasserted) states of the signals may be adjusted (e.g., reversed) accordingly to meet the design criteria of a particular implementation. Additionally, inverters may be added to change a particular polarity of the signals.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. An integrated circuit comprising:
a plurality of input/output (I/O) pads;
a first circuit configured to generate a plurality of node signals at a plurality of internal nodes; and
a second circuit configured to (i) receive said plurality of node signals at a first input, (ii) receive one or more control signals at a second input, (iii) present one or more of said plurality of node signals to one or more of said plurality of I/O pads in response to said one or more control signals and (iv) select one or more of said plurality of node signals in response to said one or more control signals, for presentation as a trigger signal at another one of said plurality of I/O pads, wherein said second circuit provides real-time observation of the one or more node signals in a first mode and single-step operation in a second mode.

2. The integrated circuit according to claim 1, wherein said plurality of node signals are indicative of an operating condition of said integrated circuit.

3. The integrated circuit according to claim 1, wherein said one or more of said plurality of node signals and said trigger signal are presented at an external I/O port configured to connect said integrated circuit to an external logic analyzer.

4. The integrated circuit according to claim 1, wherein said one or more of said plurality of node signals are time division multiplexed at said one or more I/O pads in response to said one or more control signals.

5. The integrated circuit according to claim 1, wherein said first circuit comprises a logic module of said integrated circuit.

6. The integrated circuit according to claim 1, wherein said first circuit comprises analog circuitry of said integrated circuit.

7. The integrated circuit according to claim 1, wherein said second circuit comprises a multiplexer circuit configured to connect one or more of said plurality of internal nodes to said one or more I/O pads in response to said one or more control signals.

8. The integrated circuit according to claim 7, wherein said second circuit further comprises a logic circuit configured to generate said trigger signal in response to said plurality of node signals and said one or more control signals.

9. The integrated circuit according to claim 1, wherein said second circuit comprises a register configured to present said one or more control signals.

10. The integrated circuit according to claim 1, wherein said second circuit is further configured (i) to present I/O signals at said one or more I/O pads in response to a first state of a flag signal and (ii) to present said one or more node signals at said one or more I/O pads in response to a second state of said flag signal.

11. The integrated circuit according to claim 1, further comprising an internal clock circuit configured to operate said integrated circuit at full speed in said first mode and single step said integrated circuit in said second mode, wherein said first mode and said second mode are selected in response to one or more of said control signals.

12. The integrated circuit according to claim 1, wherein:
said second circuit comprises (i) a first multiplexer circuit configured to select the one or more of said plurality of node signals in response to said one or more control signals, (ii) a register circuit configured to capture the selected one or more node signals in response to said trigger signal and (iii) a second multiplexer circuit connected to one or more of said plurality of I/O pads and configured to multiplex an output of said register circuit, the selected one or more node signals and one or more input/output signals of said integrated circuit on the one or more I/O pads in response to said one or more control signals.

13. An integrated circuit comprising:
means for connecting one or more of a plurality of internal nodes of said integrated circuit to one or more input/output (I/O) pads of said integrated circuit in response to one or more control signals;
means for selecting one or more signals generated at said plurality of internal nodes for presentation as a trigger signal at an input/output (I/O) pad of said integrated circuit in response to said one or more control signals; and
means for generating said one or more control signals, wherein in a first mode the selecting means provides real-time observation of the one or more signals generated at said plurality of internal nodes and in a second mode the selecting means provides single-step operation of the integrated circuit.

14. A method for debugging complex very large scale integrated circuits comprising:
generating one or more control signals;
connecting one or more of a plurality of internal nodes of an integrated circuit to one or more input/output (I/O) pads of said integrated circuit in response to one or more control signals; and
selecting one or more signals generated at said plurality of internal nodes for presentation as a trigger signal at another input/output (I/O) pad of said integrated circuit in response to said one or more control signals, wherein in a first mode the one or more signals generated at said plurality of internal nodes are observable in real-time and in a second mode the integrated circuit supports single-step operation.

15. The method according to claim 14, wherein said one or more control signals are generated in response to contents of a register.

16. The method according to claim 14, further comprising:
multiplexing (i) said one or more signals generated at said plurality of internal nodes, (ii) a registered version of said one or more signals and (iii) one or more input output signals of said integrated circuit on said one or more I/O pads in response to one or more control signals.

17. The method according to claim 14, further comprising:
logically combining one or more of said signals generated at said plurality of internal nodes to generate said trigger signal.

18. The method according to claim 14, further comprising:
storing a value of each of said one or more signals generated at said plurality of internal nodes in response to said trigger signal.

19. The method according to claim 18, further comprising:
generating a database of said values for each of a plurality of clock cycles.

20. The method according to claim 19, further comprising:
generating a waveform for each of said plurality of internal nodes in response to said values in said database.

* * * * *